(12) United States Patent
Geisler et al.

(10) Patent No.: US 7,253,029 B2
(45) Date of Patent: Aug. 7, 2007

(54) NON-MAGNETIC, HERMETICALLY-SEALED MICRO DEVICE PACKAGE

(75) Inventors: Carl Geisler, Methuen, MA (US); Dennis O'Keefe, Qunicy, MA (US)

(73) Assignee: M/A-Com, Inc., Lowell, MA (US)

(*) Notice: Subject to any disclaimer, the term of this patent is extended or adjusted under 35 U.S.C. 154(b) by 0 days.

(21) Appl. No.: 10/797,457

(22) Filed: Mar. 10, 2004

(65) Prior Publication Data

US 2005/0218506 A1 Oct. 6, 2005

(51) Int. Cl.
- H01L 23/495 (2006.01)
- H01L 23/10 (2006.01)
- H01L 23/06 (2006.01)

(52) U.S. Cl. ............ 438/126; 438/116; 257/677; 257/710; 257/729

(58) Field of Classification Search ........ 438/106, 438/116, 125, 126, 127; 257/659, 677, 704, 257/710, 729, 779, 783
See application file for complete search history.

(56) References Cited

U.S. PATENT DOCUMENTS

| | | | |
|---|---|---|---|
| 4,647,477 A | 3/1987 | DeLuca | 427/98 |
| 5,409,777 A | 4/1995 | Kennedy et al. | 428/411.1 |
| 5,465,008 A | 11/1995 | Goetz et al. | 257/691 |
| 5,627,406 A | 5/1997 | Pace | 257/700 |
| 5,653,841 A | 8/1997 | Krishnamurthy et al. | 156/150 |
| 5,730,922 A | 3/1998 | Babb et al. | 364/258 |
| 6,030,681 A | 2/2000 | Czubarow et al. | 428/65.3 |
| 6,271,579 B1 | 8/2001 | Going et al. | 257/664 |
| 6,316,289 B1 | 11/2001 | Chung | 438/118 |
| 6,355,491 B1 | 3/2002 | Zhou et al. | 436/518 |
| 6,406,988 B1 | 6/2002 | Chung | 438/612 |
| 6,413,339 B1 | 7/2002 | Natarajan et al. | 156/89.11 |
| 6,423,172 B1 | 7/2002 | McArdle et al. | 156/272.2 |
| 6,509,687 B1 | 1/2003 | Natarajan et al. | 313/495 |
| 6,627,814 B1 * | 9/2003 | Stark | 174/52.3 |
| 6,674,159 B1 | 1/2004 | Peterson et al. | 257/680 |
| 6,902,656 B2 * | 6/2005 | Ouellet et al. | 204/192.16 |

FOREIGN PATENT DOCUMENTS

| | | | | |
|---|---|---|---|---|
| JP | 61-058259 | * | 3/1986 | |
| JP | S61-58259 | | 3/1986 | 23/12 |

* cited by examiner

*Primary Examiner*—M. Wilczewski
*Assistant Examiner*—Pamela E Perkins

(57) ABSTRACT

A process for preparing an electronic package comprising: (a) providing a ceramic housing defining an internal cavity for receiving a micro device and having one or more interface portions; (b) treating the housing to form a tungsten layer on the interface portions; and (c) overlaying a palladium layer on the tungsten layer.

8 Claims, 3 Drawing Sheets

NON-MAGNETIC, HERMETICALLY-SEALED MICRO DEVICE PACKAGE

FIELD OF INVENTION

This invention relates to the field of packaging micro devices. More specifically, this invention relates to a micro device package which is both hermetic and non-magnetic.

BACKGROUND OF INVENTION

The packaging of micro devices is a complex field of endeavor. As used herein, the term "micro device" refers collectively to (1) microelectronic devices, such as semiconductors and integrated circuits, (2) micromechanical devices, which include static micro-machined structures such as micromirrors, multiplexers, cross-connects, optical filters and attenuators, and (3) microelectro-mechanical systems (MEMS), which include moving micro-machined structures, such as configurable micromirrors, switches, configurable multiplexers, optical filters and attenuators, and the integrated circuits used to control them.

Typically, a micro device is packaged in a housing which has a cavity to contain the micro device and an aperture through which the micro device is inserted into the cavity. The aperture of the housing is capped by a lid or cover. In the case of optical micro devices, the lid may comprise an optically clear material such as quartz or glass.

Mating and fastening the lid to housing presents a number of challenges. Among other considerations, the seal between the housing and lid must be capable of withstanding the mechanical stresses induced by vibration and by differences in the thermal expansion characteristics of the various materials used in the package. Often such stresses are sufficient to break the seal, or otherwise stress the cap to the point it cracks or develops unwanted conditions. Furthermore, in certain applications, a micro device package must be hermetically sealed. For example, it may be necessary to insulate the micro device from humidity and external elements which can degrade its performance or life, or to contain a special atmosphere within the housing to improve the performance of the micro device. A hermetic package requires that the seal between the housing and lid be not only robust, but also impervious to gaseous contaminants that could impede the operation of the micro device if they leaked into the cavity. Hermetically-sealed micro device packages are of particular interest herein.

To form a hermetic seal between the housing and the lid, it is common practice to use a metallic seal—i.e., a solder seal—between the housing and the lid. The solder seal is achieved customarily by treating the ceramic to form a narrow layer of tungsten. Tungsten is a well-known surface preparation for ceramic materials as it provides a good interface between the ceramic material and other metals, such as nickel, which are used in forming a solder seal. In this respect, nickel is also well known as a "primer" or base metal upon which other materials can be layered to facilitate a solder seal.

Although nickel is an excellent interface between tungsten and other metals for a solder seal, it tends to be magnetic which can be problematic. For example, in magnetic resonance imaging (MRI), any magnetic properties of the electronics used in the imaging equipment can negatively affect the quality of the images produced. Consequently, metallurgies using iron (Fe), nickel (Ni) or cobalt (Co) and their alloys cannot be used in micro device packaging if completely non-magnetic properties are to be achieved. Recently, this need has been addressed by attempting to render Ni non-magnetic by alloying it with other materials such as copper. To this end, current technologies employ nickel and copper deposited electrochemically in multiple thin layers. The multiple layers are thermally sintered to form a quasi non-metallic alloy. Although, theoretically, the alloy formed should be non-magnetic, applicants have discovered that this is not the case, and that micro device packages using this approach still have detrimental magnetic properties.

Therefore, there is a need for a micro device package which is not only hermetically sealed, but also non-magnetic. The present invention fulfills this need among others.

SUMMARY OF THE INVENTION

The present invention provides for a micro device package which is both hermetically sealed and non-magnetic by first determining the problem with the prior art approach and, then, providing a novel and commercially-viable solution to it.

The applicants have discovered that the problem with the current packaging technology stems from two sources. The first relates to the type of metallurgy used in the construction of the ceramic packages, and the second is the process by which the metallurgy is applied. Current technologies employ nickel and copper deposited electrochemically in multiple thin layers which are then sintered to form a quasi non-metallic alloy. This is a complex alloy which is subject to process variations. For instance, to form a non-magnetic nickel-copper alloy, the correct stoichiometry between Ni and Cu must be maintained. This, unfortunately, is difficult to accomplish. Difficulties in the electrochemical deposition process and irregularities in the surface characteristics of the ceramic housing render the thickness of the layers difficult to control. Varying thickness between the layers of nickel and copper necessarily disturbs this critical stoichiometric relationship resulting in excessive nickel in some locations and a deficiency in others at the time of sintering. This disturbance in the strochiometric balance results in an alloy having inconsistent non-magnetic properties.

The present invention avoids the prior art problems by using only a single metallurgy of palladium (Pd. Palladium is not only non-magnetic, but also has bonding characteristics with tungsten similar to those of nickel. Therefore, like nickel, palladium can be used as a "primer" for the solder seal between the housing and the lid. Furthermore, palladium can be deposited on the housing in a controlled fashion, requiring only a single layer to be applied. This is a straight forward procedure and does not depend on controlling the thickness of multiple layers. Therefore, a result of this new technology is greater control over the non-magnetic properties and the ability to provide them repeatedly and reliably in the manufacturing process. Palladium is key to the success of this technology since it is compatible with all other materials used in the package construction. Therefore, the present invention provides a new approach for packaging a micro device in a robust housing which is both hermetic and non-magnetic.

One aspect of the invention is a process for preparing a micro device housing which has a surface suitable for soldering to a lid in which the surface comprises a tungsten layer overlaid with palladium. In a preferred embodiment, the process comprises: (a) providing a ceramic housing defining an internal cavity for receiving a micro device and having one or more interface portions; (b) treating the housing to form a tungsten layer on the interface portions; and (c) overlaying a palladium layer on the tungsten layer.

Another aspect of the invention is a housing prepared from the process above. In a preferred embodiment, the housing comprises: (a) a ceramic housing defining a cavity for receiving the micro device and having one or more interface portions; (b) a tungsten layer on the interface portions; and (c) a palladium layer overlaying at least a portion of the tungsten layer.

Yet another aspect of the invention is a micro device package comprising the housing as described above. In a preferred embodiment, the micro device package comprises: (a) a housing comprising at least (i) a ceramic housing defining a cavity for receiving the micro device and having one or more interface portions; (ii) a tungsten layer on the interface portions; and (iii) a palladium layer overlaying at least a portion of the tungsten layer; (b) a micro device disposed in the cavity; and (c) a lid forming a seal with the housing along the interface portions of the housing such that the housing is hermetically sealed.

DETAILED DESCRIPTION OF PREFERRED EMBODIMENTS

Figure 1:
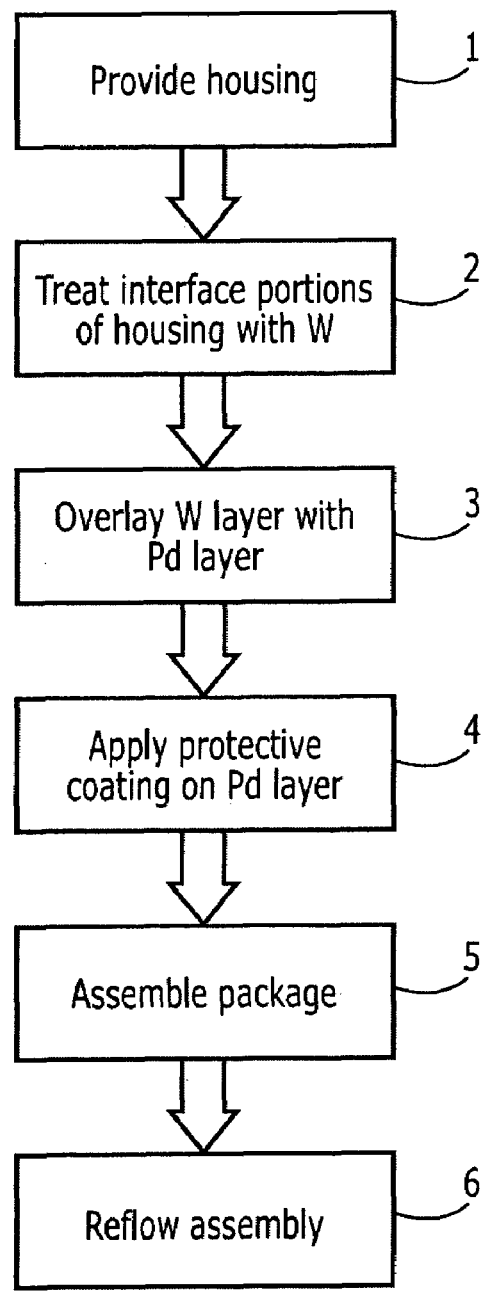
FIG. 1 shows a flow chart of the process of preparing a housing in accordance with the present invention.

Referring to FIG. 1, a flow chart of the process for preparing a micro device package in accordance with the present invention is shown. In step 1, a ceramic housing is provided. The ceramic housing defines an internal cavity for receiving a micro device and has one or more interface portions for attachment to a lid. In step 2, the housing is treated to form a tungsten layer on the interface portions. The tungsten infiltrates the surface of the interface portions and provides a base on which other metals may be deposited. In step 3, a palladium layer is overlaid on the tungsten layer. The palladium layer forms a foundation for establishing a solder seal between the housing and the lid. It may be preferable to coat the palladium layer with a protective coating to minimize oxidation in Step 4.

Figure 2:
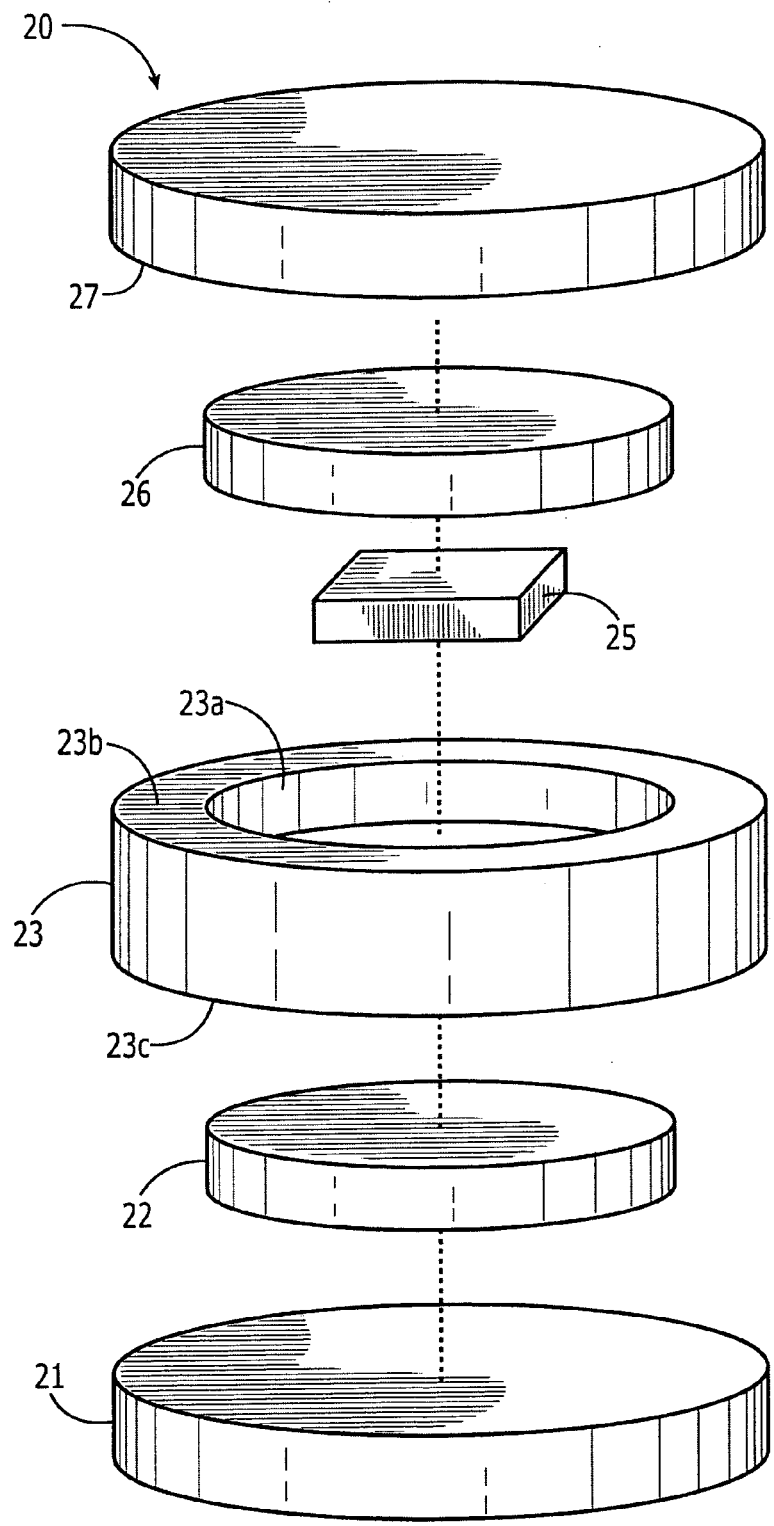
FIG. 2 shows a micro device package in an exploded view.
Figure 3:
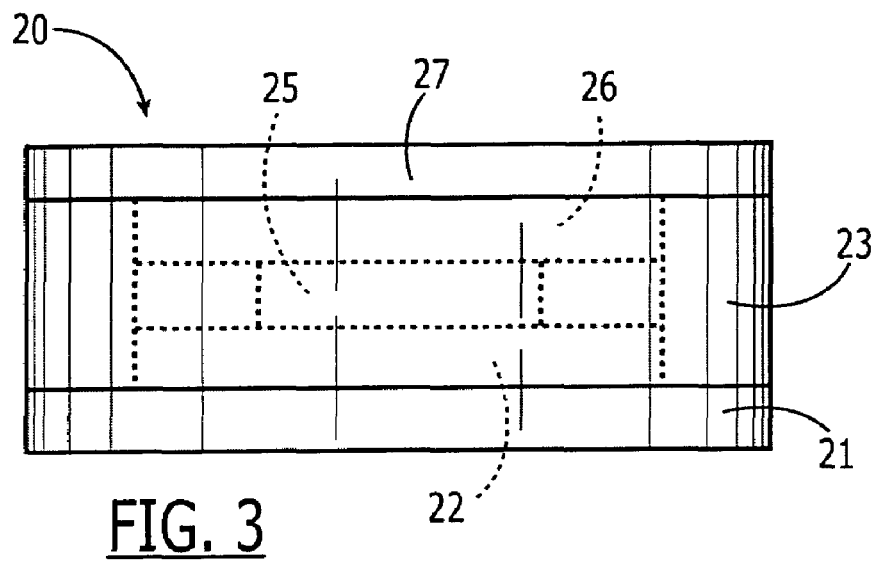
FIG. 3 shows the assembled micro device package of FIG. 2.

At this point, a housing is prepared which may be marketed as a discrete unit for packaging by others or it may be combined with other components to form a micro device package. If a micro device package is desired, the process continues to step 5, assembly. In this step, the micro device is disposed in the cavity of the housing, and the lid is positioned along the interface portions of the housing. Finally, in step 6, the assembled package is heat treated to reflow the metals along the interface portions of the housing, thereby creating a solder seal between the housing and the lid. A typical micro device package is shown in FIGS. 2 and 3 in exploded and assembled views, respectively.

Each of these steps is described below in detail with reference to FIGS. 2 and 3.

Step 1

Step 1 of the process comprises obtaining or providing a ceramic housing for the micro device. This step contemplates either the manufacture of the housing or its purchase from others. Such housings are well known in the industry and are commercially available from a number of sources.

The material used can be any known ceramic material. As used herein, the term "ceramic" refers to oxides, nitrides, carbides, borides and suicides of metals or semi-metals and combinations thereof. Examples of such suitable materials include, but are not limited to, aluminum oxide, aluminum nitride, silicon carbide, silicon nitride, tin oxide, titanium carbide, titanium oxide and dioxide, iron silicide, hafnium oxide and zirconium oxide, molybdenum disilicide, lithium aluminate, ferrites, and PZT (lead zirconium titanate). Preferably, the ceramic is non-magnetic (i.e. the base metal or semi-metal is nonferrous). More preferably, the ceramic is aluminum oxide.

These materials can be formed into housings of various sizes and shapes, providing that the housings define some interior space or cavity for receiving the micro device and an aperture to access the cavity. The housing also has one or more interface portions. As used herein, the term "interface portion" refers to the portion of the housing which is joined to another component of the package, such as the lid. Examples of suitable housing configurations include ring shaped, cup shaped, cylindrical, rectangular, oblong, etc. The housing may be integrally molded or it may be an assembly of two or more components. Such configurations are well known in the art.

The cavity defined by the housing may be sized to accommodate one or more micro devices in a single cavity. Furthermore, the housing may define two or more cavities for accommodating a multitude of micro devices. To provide signals and power to a micro device contained in an assembled package, the housing may have one or more passages to provide conductive paths between the outside of the housing and the micro device disposed in the cavity. Such configurations are well known in the art. (See, for example, U.S. Pat. No. 6,271,579.) Alternatively, the micro device may be powered/controlled via a conductive lid which is electrically coupled to the micro device either directly or indirectly.

Referring to FIGS. 2 and 3, an example of a suitable housing is depicted. In this embodiment, the housing 23 comprises a ring or annular disk of aluminum oxide defining a single cavity 23a for receiving a micro device 25. The housing has top and bottom planar surfaces 23b, 23c, which are the interface portions. This particular housing is commercially available from a variety of sources including GBC materials (location Latrobe, Pa.).

Step 2

It is often necessary that the interface portion make a hermetic seal with other components of the package. Hermetic seals preferably involve a metallic seal, such as solder. To facilitate a solder seal, the ceramic material must be treated initially with tungsten to provide a "base" upon which other metals can be applied. Accordingly, in step 2, once the ceramic housing is provided, it is treated with tungsten at one or more interface portions.

Treating the interface portions of the housing with tungsten is a well known process. In this step, any number of known metal application techniques can be used, including, for example, thick film techniques (e.g., paste, dipping, screening, etc.) and thin film techniques (e.g., sputtering, vapor deposition, etc.). Preferably, thick film technology is used since the precision required in this step is not great, and thick film techniques lend themselves to low-cost, bulk processing. Once the tungsten is applied to the housing, well-known high temperature co-fired ceramic (HTCC) techniques may be used to flow the tungsten such that it infiltrates the adjacent ceramic material.

For example, in the process used to prepare the micro device package depicted in FIGS. 2 and 3, the top interface portion 23b and a bottom interface portion 23c are treated with tungsten. To this end, a multiplicity of housings are placed on a substrate, such as a rubber mat, each with their top interface portion 23a exposed through a hole in the mat. (It should be apparent that the order of treating the top and bottom interface portions can be reversed.) Once the housings are placed on the substrate, they are dipped in a tungsten paste at room temperature. The paste comprises tungsten and binders and is commercially available from DuPont. The thickness of the paste applied to the ceramic housing is controlled by regulating its viscosity. The thickness of the paste can vary according to particular applications, although, generally, a thickness of between 0.0005" and 0.0015" is preferred.

After the ceramics housings are dipped, they are removed from the rubber mat and dried in an oven. Although drying conditions can vary, it has been found that an oven temperature of 150-250° C. and a dry time of about 15 Minutes provide suitable results. Once the tungsten paste dries the housings are again placed on the rubber mat such that their bottom interface portion 23c is exposed to be dipped. Once dipped, these ceramic housings are again placed in an oven to dry.

Once the tungsten is dried, the tungsten-coated, ceramic housings are placed in an oven to facilitate the tungsten's impregnation of the ceramic surface using a high temperature co-fired ceramic (HTCC) technique. This is a well know technique and is described, for example, in U.S. Pat. No. 6,271,579. Briefly, the housings are subjected to temperatures of about 1550° C. to about 1650° C. for a period of about 5 minutes to about 20 Minutes. During this step, the tungsten flows to impregnate the interface portions of the housing. It has been found that the tungsten will infiltrate about 50 microinches to about 500 microinches into the ceramic surface. This provides the tungsten with solid purchase in the ceramic, allowing the tungsten layer to act as a foundation for other metal layers to facilitate a solder seal.

Step 3

Although tungsten provides a sound base upon which other metals may be deposited, it is, itself, not solderable. Therefore, to form a hermetic seal along the interface portions of the ceramic housing, the tungsten layer must be coated with a material which is solderable but which is not magnetic. The applicants have found that palladium serves this purpose well.

In the third step, palladium is applied to the interface region, overlaying the tungsten layer. The palladium may be applied to the tungsten layer in a variety of known techniques including, for example, thick film techniques and thin film techniques. Preferably, it is applied in a single operation to avoid consistency issues. It has been found that certain economies can be realized by taking advantage of the conductive tungsten layer already present on the ceramic housing. That is, it has been found that palladium can be deposited on to the tungsten layer by traditional liquid-phase, electrolytic deposition. Such techniques are well known and reliable. The thickness of the palladium layer can vary with applications, although it has been found that a palladium thickness of about 25 microinches to about 150 microinches is suitable for most applications.

For example, in the preparation of the housing 23 depicted in FIGS. 2 and 3, the housing is first cleaned using an acid wash to remove oxides and other impurities on the tungsten surface. Next, the housing is placed in an electrolytic bath containing ionized palladium in a caustic solution. The concentration of the palladium in the bath can vary, although concentrations of about 2 g/liters to about 7 g/liter have been found to provide suitable results. The palladium electrolytic solution is commercially available from Shipley. The bath is maintained at a room temperature 120° F. A cathode is disposed approximately 6" from the housing (which is effectively the anode). A voltage is applied across the housing and the cathode to effect the plating of the positively charged palladium ions on the housing. It has been found that a current of about 5 to about 25 amps provides suitable results. After approximately 15 minutes or when a palladium layer of approximately 100 micro-inches is deposited, the electrolytic deposition process is halted. The palladium plated housings are then removed from the bath and rinsed.

Step 4

The palladium provides a "solderable" surface for the seal between the housing and the lid. It may be preferable to finish the palladium surface with a protective coating to inhibit oxidization. Such coatings are well known and include, for example, silver or gold. As with the palladium, the conductive properties of the tungsten and palladium surfaces can be exploited to electrolytically plate the palladium surface with the non-oxidizing material. It should be understood, however, that any traditional metal application technique can be used as well.

Once the palladium is applied to the interface region along with the protective coating, if any, the package is ready to be assembled and the lid soldered in place to form a hermetic package. To this end, the housing may be shipped to others for final assembly or it may be completed in a continuous process.

Step 5

In step 5, the micro device package is assembled. This involves disposing the micro device in the cavity and placing one or more lids on the interface portion of the housing. As mentioned above, the lid may comprise a ceramic structure which is different, similar or identical to the housing. Alternatively, the lid may be a conductive member to facilitate the transmission of power/signals to the micro device contained in the package. If the micro device is an optical device, the lid may be optically transparent. Indeed, there are a myriad of well known configurations for the lid. The assembly of the package is preferably performed en masse to exploit economies of scale.

For example, referring to FIG. 2, the assembly of one particular micro device package 20 is considered in detail. In the assembly of this micro device package, a number of lids are placed on a substrate or "boat" (not shown). The lids, in this example, are solder preforms 21. On each solder preform 21, a housing 23 having a cavity 23a is placed such that its bottom interface portion (coated with tungsten and palladium) contacts the solder perform. Next, a molybdenum plug 22 is inserted into the cavity 23a such that it contacts the housing 23 and the solder preform 21. At this point, the micro device 25 is inserted into the housing cavity. The particular micro device 25 depicted in this figure has electrical contacts on its top and bottom sides. It is disposed in the cavity 23a such that its bottom contact contacts the molybdenum plug. Next, a second molybdenum plug 26 is deposed over the micro device 25 such that it contacts the micro device's top electrical contact. Finally, a second lid, which is also a solder preform 27, is placed on top of the housing 23 to complete the assembly.

Step 6

Once these components have been assembled, the assembly is placed in a furnace to reflow the solder. During reflow, a solder seal develops between the housing and the lid thereby hermetically sealing the package. Additionally, the reflow process may complete the conductive paths between the micro device and the contacts on the outside of the housing.

In the embodiment depicted in FIGS. 2 and 3, an entire boat of assemblies is placed in a furnace to reflow the metal layers disposed at the interface surface. The furnace is operated at a temperature of about 250° C. to about 400° C. After approximately 15 minutes, the boat is removed. During reflow a solder seal develops between the housing and the lid along the interface portions. Additionally, a conductive connection is effected from the bottom contact of the micro device 25, through the molybdenum plug 22, and the solder preform 21, and from the top contact of the micro device 25, though the molybdenum plug 26, and the solder perform 27.

After reflow, the assembly is complete and can be removed from the boat and incorporated into larger electronic systems.

It should be understood that the examples above with respect to FIGS. 2 and 3 were for illustrative purposes and should not be used to limit the scope of the invention. One skilled in the art in light of this disclosure will appreciate that the present invention can be practiced with a wide variety of housing configurations and micro device types.

What is claimed is:

1. A process for preparing an electronic package comprising:
    providing a ceramic housing defining an internal cavity for receiving a micro device and having at least one interface portion;
    treating said housing to form a tungsten layer on said interface portion; and
    overlaying a palladium layer on said tungsten layer on said interface portion to render it a solderable interface portion suitable for soldering to another component;
    disposing said micro device in said cavity, and
    placing a lid on said housing along said solderable interface portion and exposing said housing to temperatures sufficient to reflow said palladium layer to form a solder seal between said housing and said lid.

2. The process of claim 1, wherein said tungsten layer is formed by applying tungsten to said interface portion using a thick film technique.

3. The process of claim 2, wherein said tungsten layer is formed using a high temperature co-fired ceramic technique.

4. The process of claim 1, wherein said tungsten layer is a about 0.0005"to about 0.001 5"thick.

5. The process of claim 1, wherein said palladium layer is applied to said tungsten layer elecirolytically.

6. The process of claim 5, wherein said palladium layer is about 25micro-inches to about 150 micro-inches thick.

7. The process of claim 1, further comprising applying a protective coating to said palladium layer.

8. The process of claim 7, wherein said solderable interface portion consists essentially of said tungsten layer, said palladium layer, and said protective coating.

* * * * *